United States Patent
Chang et al.

(10) Patent No.: US 6,706,596 B2
(45) Date of Patent: Mar. 16, 2004

(54) METHOD FOR FORMING FLASH MEMORY CELL

(75) Inventors: Ping-Yi Chang, Kaohsiung (TW); Wan-Yi Liu, Kaohsiung (TW); Shu-Li Wu, Nan-Tao (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/209,855

(22) Filed: Aug. 2, 2002

(65) Prior Publication Data

US 2002/0197796 A1 Dec. 26, 2002

Related U.S. Application Data

(63) Continuation-in-part of application No. 09/862,495, filed on May 23, 2001, now abandoned.

(51) Int. Cl.[7] ............................................. H01L 21/8247
(52) U.S. Cl. ........................ 438/260; 438/593; 438/788
(58) Field of Search ............................. 438/260, 263, 438/264, 296, 424, 593, 594, 657, 665, 695, 788, 792, 964

(56) References Cited

U.S. PATENT DOCUMENTS

| | | | |
|---|---|---|---|
| 5,010,028 A | 4/1991 | Gill et al. .................... | 438/263 |
| 5,763,309 A | 6/1998 | Chang ........................ | 438/296 |
| 5,814,543 A | 9/1998 | Nishimoro et al. ......... | 438/592 |
| 6,203,863 B1 * | 3/2001 | Liu et al. .................... | 438/788 |
| 6,248,631 B1 | 6/2001 | Huang et al. ............... | 438/260 |
| 6,368,988 B1 * | 4/2002 | Li et al. ...................... | 438/792 |

\* cited by examiner

Primary Examiner—Chandra Chaudhari

(57) ABSTRACT

The present invention provides a method for forming a flash memory cell and comprises following steps. First, a substrate is provided. Then, a gate dielectric layer, a first polysilicon layer and a hard mask layer are sequentially formed on the substrate. Next, a portion of the hard mask layer, the polysilicon layer, and the gate dielectric layer are removed to form a plurality of holes to expose the substrate. Following, a dielectric layer is formed in those holes by a HDPCVD process. Last, the hard mask layer on the first polysilicon layer is removed by the HDPCVD process. Further, a second polysilicon layer could be conformally formed on the first polysilicon layer and the isolation dielectric.

20 Claims, 3 Drawing Sheets

METHOD FOR FORMING FLASH MEMORY CELL

This application is a continuation-in-part of the original application numbered as Ser. No. 09/862,495, which filed May 23, 2001.

BACKGROUND OF THE INVENTION

1. Field of the Invention

The present invention generally relates to a method for forming a flash memory cell, and more particularly relates to a method for forming a flash memory cell by using a high-density plasma enhanced chemical vapor deposition (HPDCVD) process.

2. Description of the Prior Art

Flash memory is the most potential memory in the semiconductor industry. Flash memory have been broadly applied to replicatively access date but not disappear as power breaking down, such as the film of digital camera or the basic input-output system of a mother board, because flash memory has the advantages of electrically erasable and programmable mechanisms. Flash memory can simultaneously proceed the erase and the program mechanisms to all flash memory cells in the whole memory's array. Accordingly, how to advance the performance and reduce the cost of the flash memory becomes an important subject.

In the conventional method for forming a flash memory cell, the isolation oxide is formed and then a planarization process is performed, such as a chemical mechanism polishing (CMP) process or an etching back process. In the process steps, the CMP process is difficult controlled and the common disadvantages are dishing or erosion on the surface. Also in the process step, the etching back process is complicated and the common disadvantages are high costs. Hence, there are many solutions to overcome the disadvantages of the conventional planarization process. Moreover, it is more and more important to integrate the processes and to increase the efficiency of the flash memory.

SUMMARY OF THE INVENTION

An object of the invention is to provide a method for forming a flash memory cell by using a HDPCVD process to form the desired dielectric layer for isolation.

Another object of the invention is to provide a method for forming a flash memory cell, which can effectively increase the storage of electrical charges.

In order to achieve previous objects, the present invention provides a method for forming a flash memory cell and comprises following steps. First, a substrate is provided. Then, a gate dielectric layer, a first polysilicon layer and a hard mask layer are sequentially formed on the substrate. Next, portion of the nitride layer, the polysilicon layer and the gate dielectric layer are removed to form a plurality of holes to expose the substrate. Following, a dielectric layer is formed in those holes by the HDPCVD process with a first parameters set. Last, the hard mask layer on the first polysilicon layer is removed by the HDPCVD process with a second parameters set. Further, a second polysilicon layer could be conformally formed on the first polysilicon layer and the dielectric layer.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The semiconductor devices of the present invention are applicable to a broad rang of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Figure 1A:
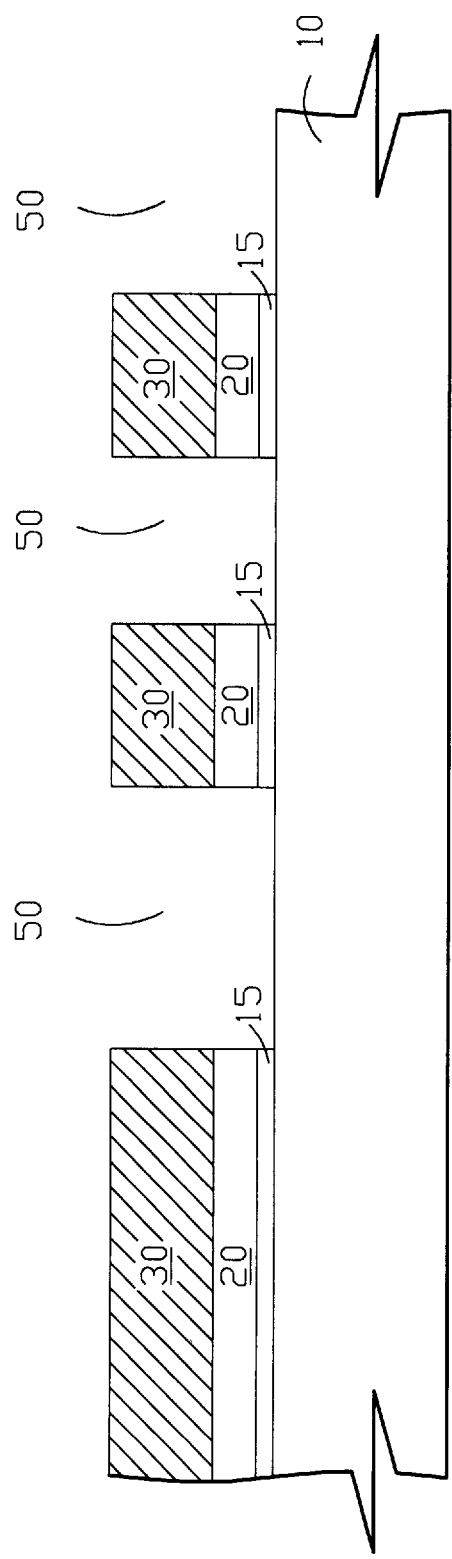
FIG. 1A to FIG. 1F are the schematic representations of structures at various stages during the formulation of a flash memory cell, in accordance with the present invention.

Referring to FIG. 1A, a substrate 10 is provided. Then, a gate dielectric layer 15 and a first polysilicon 20 layer are deposited on the substrate 10 in sequence. Next, a hard mask layer 30 is deposited on the first polysilicon layer 20. The hard mask layer 30 usually is made of nitride, especially silicon nitride. Following, a lithography process is performed to remove a portion of the hard mask layer 30, the first polysilicon layer 20 and the gate dielectric layer 15 such that a plurality of holes 50 are formed to expose the substrate 10.

Figure 1B:
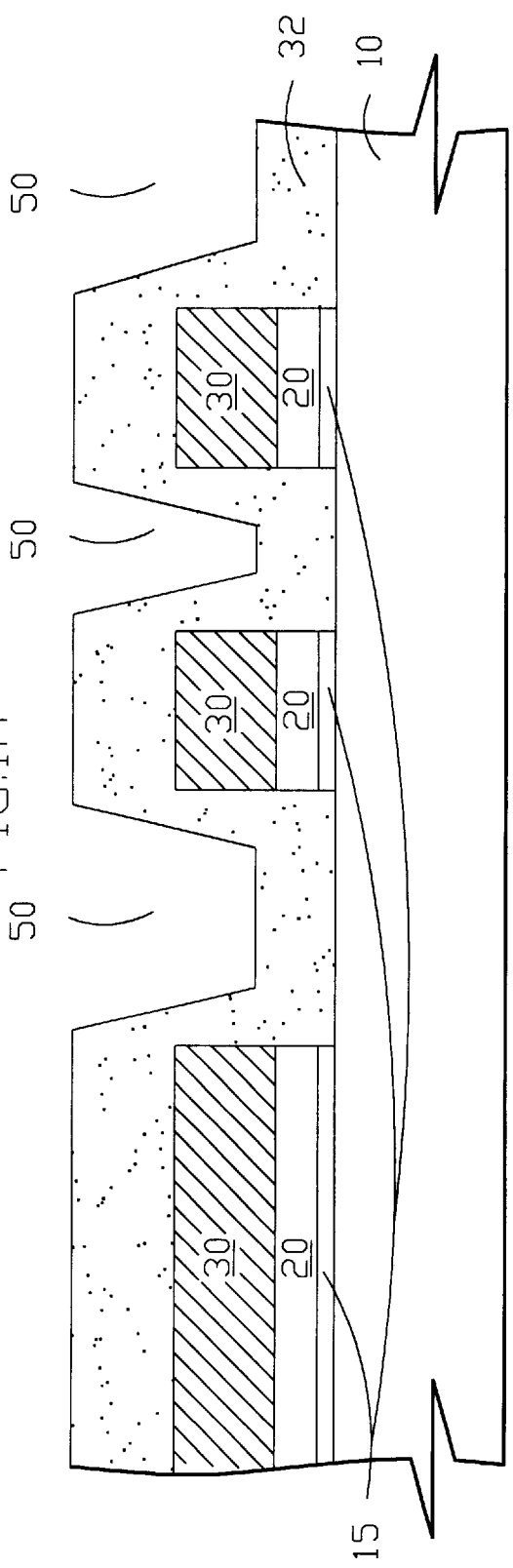

Referring to FIG. 1B, a dielectric layer 32 is formed on both the hard mask layer 30 and those holes 50 by a high-density plasma chemical vapor deposition process with a first parameters set. Herein, the distribution could be conformal or non-conformal, and the thickness of the dielectric layer 32 could be thicker than or thinner than the thickness of the first polysilicon layer 20. Further, the dielectric layer 32 usually is made of oxide and usually is used as the isolation in a flash memory cell.

Figure 1C:
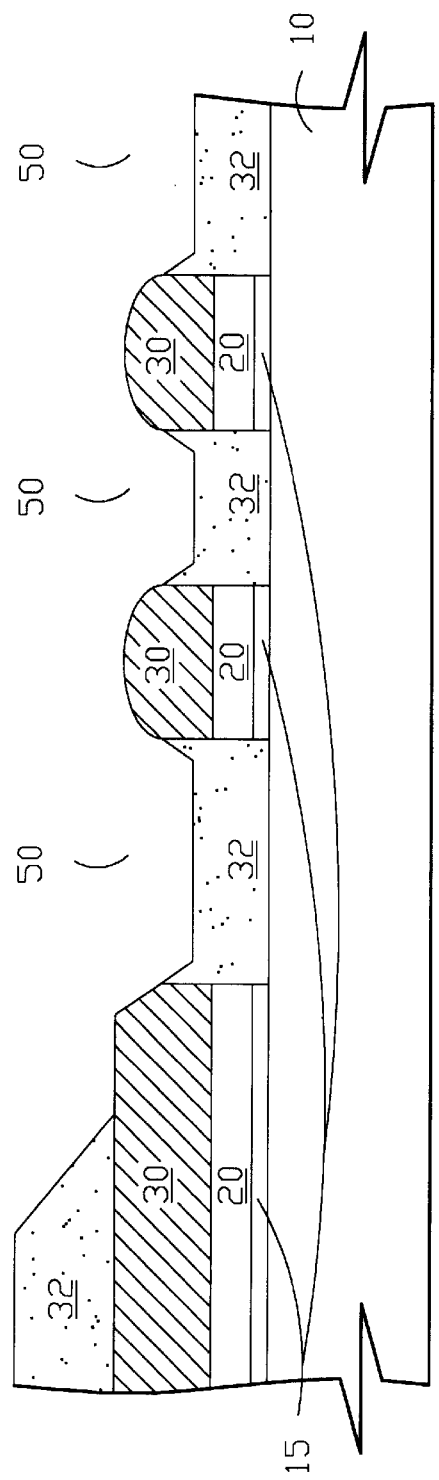

Referring to FIG. 1C, a sputtering process is performed to remove a portion of the dielectric layer 32 to expose a portion of the hard mask layer 30. Herein, the sputtering process is provided by the high-density plasma chemical vapor deposition process with a second parameters set. Further, the remained dielectric layer 32 in those holes 50 could be gibbous in a sidewall of those holes.

Figure 1D:
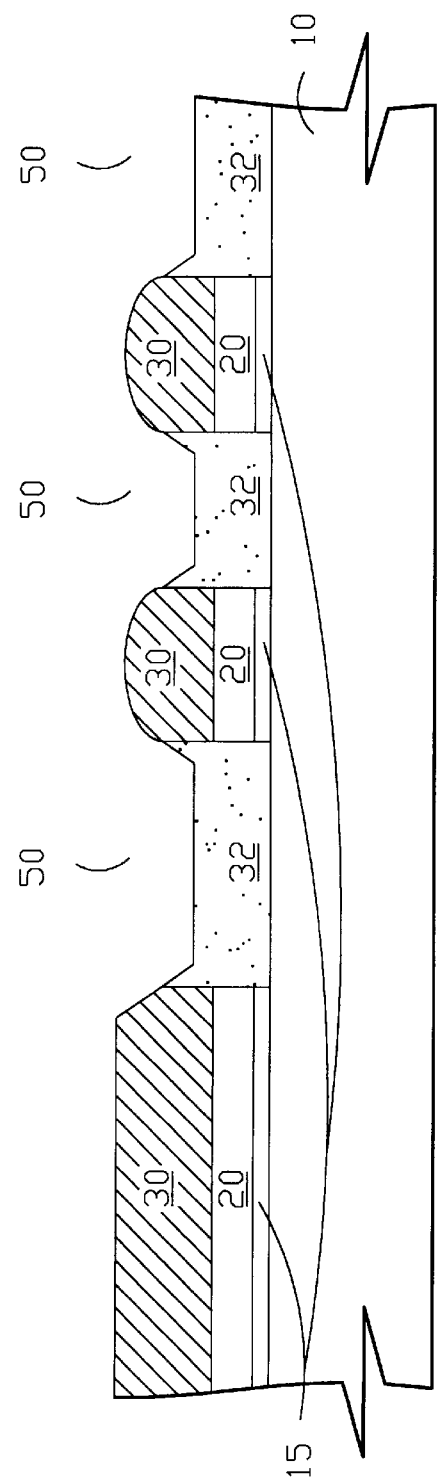

Referring to FIG. 1D, then, the remained dielectric layer 32 on the hard mask layer 30 is removed. The remained dielectric layer 32 on the hard mask layer 30 could be removed by the following essential steps. First, a mask is formed to cover the remained dielectric layer 32 in those holes 50. Then, the remained dielectric layer 32 on the hard mask layer 30 is removed by using a wet etching process. Last, the mask is removed. However, the remained dielectric layer 32 on the hard mask layer 30 also could be removed by the high-density plasma chemical vapor deposition with a third parameters set.

Figure 1E:
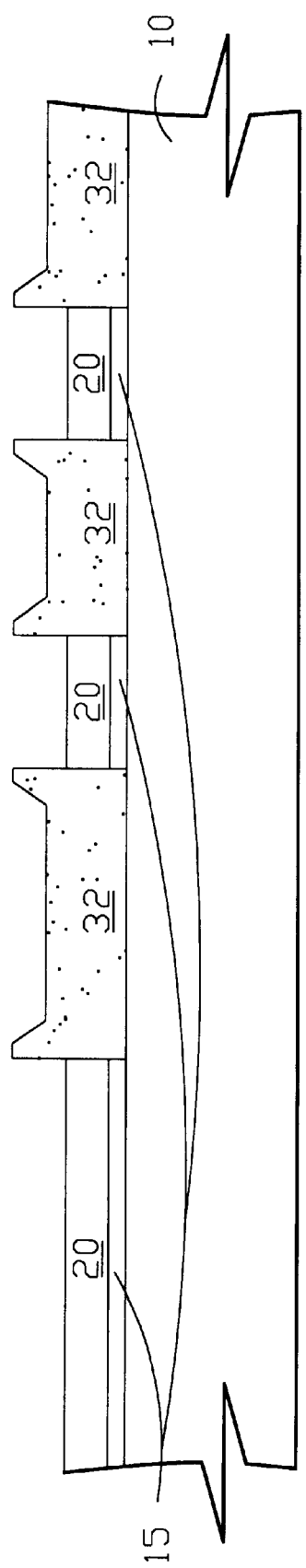

Next, referring to FIG. 1E, the hard mask layer 30 is removed. For example, the hard mask layer 30 could be stripped by using an etching process or could be removed by using the high-density plasma chemical vapor deposition process with a third parameters set. Further, the hard mask layer 30 also could be removed by the following essential steps: forming a mask to cover remained the dielectric layer 32 in the holes 50; using a wet etching process to remove the hard mask 30 layer; and removing the mask. Herein, the remained dielectric layer 32 in those holes 50 could be gibbous in a surface of the first polysilicon layer 20. Herein, the remained dielectric layer 32 could be thicker than or thinner than the first polysilicon layer 20.

Figure 1F:
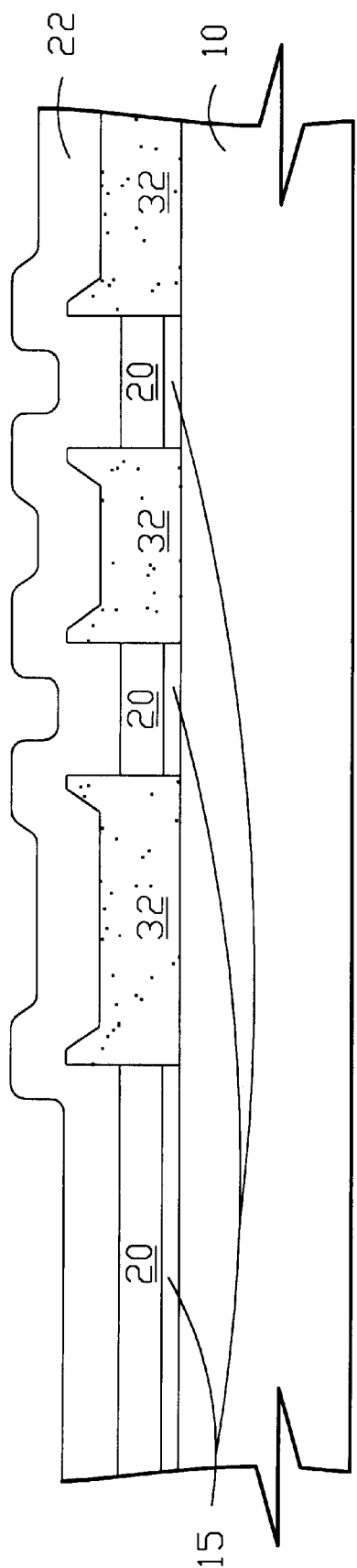

Further, referring to FIG. 1F, a second polysilicon layer 22 could be deposited, even conformally deposited, on the first polysilicon layer 20 and the dielectric layer 32.

Significantly, the application of the high-density plasma chemical vapor deposition process is one of main characteristics of the present invention. For the conventional prior arts, the HDPCVD process usually only is used to deposit the dielectric layer. In contrast, the present uses the HDPCVD process to form the dielectric layer and to remove the dielectric layer separately.

In general, the first parameters set, which corresponds to the formation of the dielectric layer, comprises a flow rate of an oxygen gas, a flow rate of an inert gas, a flow rate of a SiH4 gas, and a period of a deposition. However, it should be noticed that the first parameters set does not comprise a biased voltage on the substrate.

In general, the second parameters set comprises a flow rate of an inert gas, a period of an etching, and a biased voltage on the substrate. Sometimes, the second parameters set also comprises a flow rate of an oxygen gas, and the period of etching is about 20 seconds to 50 seconds.

Clearly, the main differences between first parameters an second parameters set are the following: (1) the HDPCVD process for forming, such as deposition, dielectric layer does not apply any biased voltage on the substrate. (2) the HDPCVD process for removing, such as etch, dielectric layer does not apply reactive gas(es) to induce a chemical reaction on the dielectric layer.

Clearly, because the HDPCVD process could be used to remove the dielectric layer, the HDPCVD process also could be used to remove the hard mask layer, which usually also is a dielectric layer, as disclosed above. Indisputably, the third parameters set is alike to the second parameters set, and the differences between the third parameters set and the second parameters set are dependent on the difference between the dielectric layer, which usually is an oxide layer, and the hard mask layer, which usually is a nitride layer or a silicon nitride layer.

Finally, the application of the HDPCVD process at least has the following advantages. (1) No chemical mechanical process is required, and then defects such as scratch and dishing are avoided. (2) The HDPCVD process could be performed with different parameters sets in the same chamber. Thus, the in-situ characteristic of the HDPCVD could effectively prevent the disadvantages of the etching back process.

Of course, it is to be understood that the invention need not be limited to these disclosed embodiments. Various modification and similar changes are still possible within the spirit of this invention. In this way, the scope of this invention should be defined by the appended claims.

What is claimed is:

1. A method for forming a flash memory cell, said method comprising:

providing a substrate;

forming a gate dielectric layer on said substrate;

forming a first polysilicon layer on said gate dielectric layer;

forming a hard mask layer on said first polysilicon layer;

patterning said hard mask layer, said first polysilicon layer and said gate dielectric layer to form a plurality of holes to partially expose said substrate;

forming a dielectric layer on both said hard mask layer and the exposed portion of said substrate by a high-density plasma enhanced chemical vapor deposition process with a first parameters set;

removing a portion of said dielectric layer to expose said hard mask layer by said high-density plasma enhanced chemical vapor deposition process with a second parameters set; and removing said hard mask layer.

2. The method according to claim 1, wherein said gate dielectric layer is a thermal oxide layer.

3. The method according to claim 1, wherein said hard mask layer is a nitride layer.

4. The method according to claim 1, wherein said hard mask layer is a silicon nitride layer.

5. The method according to claim 1, wherein said first parameters set comprises a flow rate of an oxygen gas, a flow rate of an inert gas, a flow rate of a SiH4 gas, and a period of a deposition.

6. The method according to claim 1, wherein said first parameters set does not comprise a biased voltage on said substrate.

7. The method according to claim 1, wherein said second parameters set comprises a flow rate of an inert gas, a period of an etching, and a biased voltage on said substrate.

8. The method according to claim 7, wherein said second parameters set further comprises a flow rate of an oxygen gas.

9. The method according to claim 7, wherein said period of said etching is about 20 seconds to 50 seconds.

10. The method according to claim 1, wherein the step of removing said hard mask layer comprises following steps:

forming a mask to cover unremoved portions of said dielectric layer;

using a wet etching process to remove said hard mask layer; and removing said mask.

11. The method according to claim 1, wherein said hard mask layer is removed by said high-density plasma enhanced chemical vapor deposition process with a third parameters set.

12. The method according to claim 1, wherein said dielectric layer is gibbous in the sidewalls of said holes before the step of removing said hard mask layer.

13. The method according to claim 1, wherein the thickness of said dielectric layer is different than the thickness of said first polysilicon layer before the step of removing said hard mask layer.

14. The method according to claim 1, wherein said high-density plasma enhanced chemical vapor deposition processes of the dielectric layer forming step and the dielectric layer removing step are performed in a same chamber.

15. The method according to claim 11, wherein said high-density plasma enhanced chemical vapor deposition processes of the dielectric layer forming step, the dielectric layer removing step and the hard mask layer removing step are performed in a same chamber.

16. The method according to claim 1, wherein said dielectric layer is an oxide layer.

17. The method according to claim 5, said inert gas is argon.

18. The method according to claim 7, said inert gas is argon.

19. The method according to claim 1, further comprising a step of forming a second polysilicon layer on both said first polysilicon layer and unremoved portions of said dielectric layer after the step of removing said hard mask layer.

20. The method according to claim 19, said second polysilicon layer conformally covers both said first polysilicon layer and unremoved portions of said dielectric layer.

* * * * *